(12) United States Patent
Singh

(10) Patent No.: US 9,741,713 B1
(45) Date of Patent: Aug. 22, 2017

(54) PARASITIC LATERAL BIPOLAR TRANSISTOR WITH IMPROVED IDEALITY AND LEAKAGE CURRENTS

(71) Applicant: GLOBALFOUNDRIES Inc., Grand Cayman (KY)

(72) Inventor: Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 11 days.

(21) Appl. No.: 15/138,954

(22) Filed: Apr. 26, 2016

(51) Int. Cl.
| | |
|---|---|
| *H01L 29/66* | (2006.01) |
| *H01L 27/06* | (2006.01) |
| *H01L 29/735* | (2006.01) |
| *H01L 29/73* | (2006.01) |
| *H01L 23/535* | (2006.01) |
| *H01L 29/161* | (2006.01) |
| *H01L 29/36* | (2006.01) |
| *H01L 21/8249* | (2006.01) |
| *H01L 21/265* | (2006.01) |
| *H01L 21/306* | (2006.01) |

(52) U.S. Cl.
CPC ...... *H01L 27/067* (2013.01); *H01L 21/26506* (2013.01); *H01L 21/30604* (2013.01); *H01L 21/8249* (2013.01); *H01L 23/535* (2013.01); *H01L 29/161* (2013.01); *H01L 29/36* (2013.01); *H01L 29/6625* (2013.01); *H01L 29/7302* (2013.01); *H01L 29/735* (2013.01)

(58) Field of Classification Search
CPC ............. H01L 21/8222; H01L 21/8239; H01L 21/8249
See application file for complete search history.

(56) References Cited

U.S. PATENT DOCUMENTS 6,353,520 B1 * 3/2002 Andresen ............ H01L 27/0251 361/56

\* cited by examiner

*Primary Examiner* — Elias M Ullah
(74) *Attorney, Agent, or Firm* — Wayne F. Reinke, Esq.; Heslin Rothenberg Farley & Mesiti P.C.

(57) ABSTRACT

A semiconductor structure includes a semiconductor substrate of n-type or p-type, a well of a type opposite the substrate, the well acting as the base of a diode, a first region of the same type as the substrate at a top of the well, a second region of the same type as the substrate is situated separate from the first region at the top of the well, the first region acting as an emitter of the diode and the second region acting as a collector of the diode, and a gate situated between the first region and second region over a top surface of the well.

20 Claims, 3 Drawing Sheets

PARASITIC LATERAL BIPOLAR TRANSISTOR WITH IMPROVED IDEALITY AND LEAKAGE CURRENTS

BACKGROUND OF THE INVENTION

Technical Field

The present invention generally relates to bipolar transistors. More particularly, the present invention relates to improved ideality and leakage current for parasitic lateral bipolar transistors.

Background Information

Parasitic Lateral Bipolar Transistors (PLVTs) have a unique application to temperature sensors and band gap reference circuits. However, current fabrication of PLVTs includes an extra mask and independent processing steps.

Thus, a need exists for PLVTs that do not suffer the noted shortcomings.

SUMMARY OF THE INVENTION

The shortcomings of the prior art are overcome and additional advantages are provided through the provision, in one aspect, of a semiconductor structure. The semiconductor structure includes a semiconductor substrate of a first type, the first type includes one of p-type and n-type, and a well of a second type opposite the first type, the well acting as a base of a diode. The semiconductor structure includes a first region of the first type at a top of the well, a second region of the first type separate from the first region at the top of the well, the first region acting as an emitter of the diode and the second region acts as a collector of the diode, and a gate situated between the first region and second region over a top surface of the well.

In accordance with another aspect, a method of fabricating a parasitic lateral bipolar transistor is provided. The method includes providing a starting semiconductor structure, the starting semiconductor structure including a semiconductor substrate of a first type and a well of a second type opposite the first type above the semiconductor structure, each of the first type and second type include one of n-type and p-type. The method further includes forming a first region of the first type and a second region of the first type at a top portion of the well, and forming a gate situated between the first region and second region over a top surface of the well. When in use, the well acts as a base of a diode, the first region acting as an emitter of the diode and the second region acting as a collector for the diode.

These, and other objects, features and advantages of this invention will become apparent from the following detailed description of the various aspects of the invention taken in conjunction with the accompanying drawings.

DETAILED DESCRIPTION OF THE INVENTION

Figure 1:
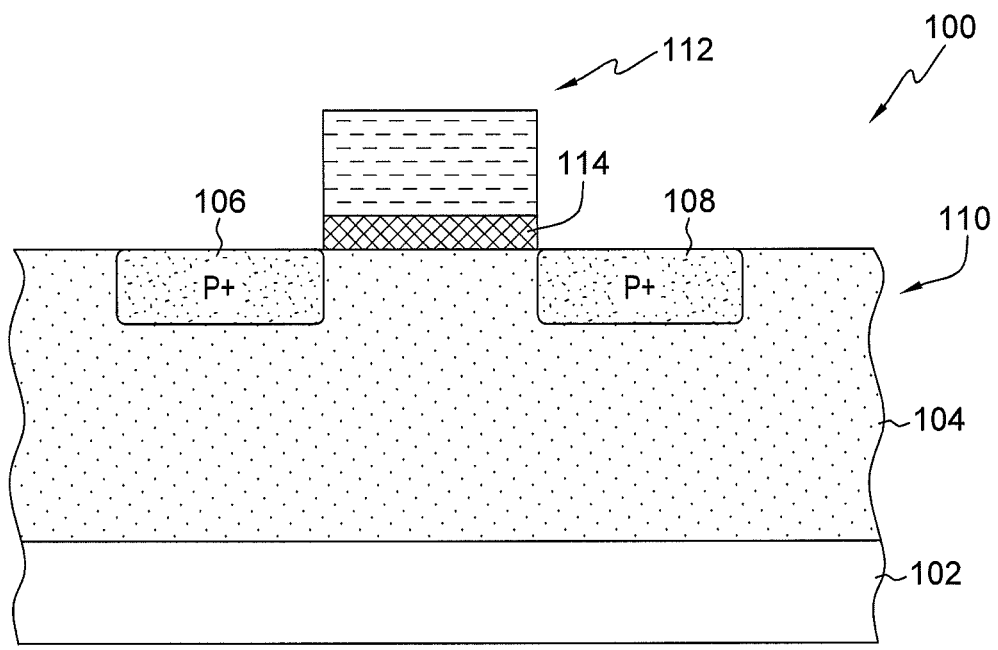
FIG. 1 is a cross-sectional view across the gate of one example of a parasitic lateral bipolar transistor, the parasitic lateral bipolar transistor including a semiconductor substrate of n-type or p-type, a well of the other type, a first region and a second region of a same type as the semiconductor substrate in a top portion of the well, and a gate structure with a dielectric layer over the well, and between the first region and second region, the well, the first region and the second region acting as a base, emitter and collector of a parasitic lateral bipolar transistor, respectively, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view across the gate of one example of a parasitic lateral bipolar transistor 100, the parasitic lateral bipolar transistor including a semiconductor substrate 102 of n-type or p-type, a well 104 of the other type, a first region 106 and a second region 108 of a same type as the semiconductor substrate in a top portion 110 of the well, and a gate structure 112 with dielectric layer 114 over the well, and between the first region and second region, the well, the first region and the second region acting as a base, emitter and collector of a parasitic lateral bipolar transistor, respectively, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substance including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
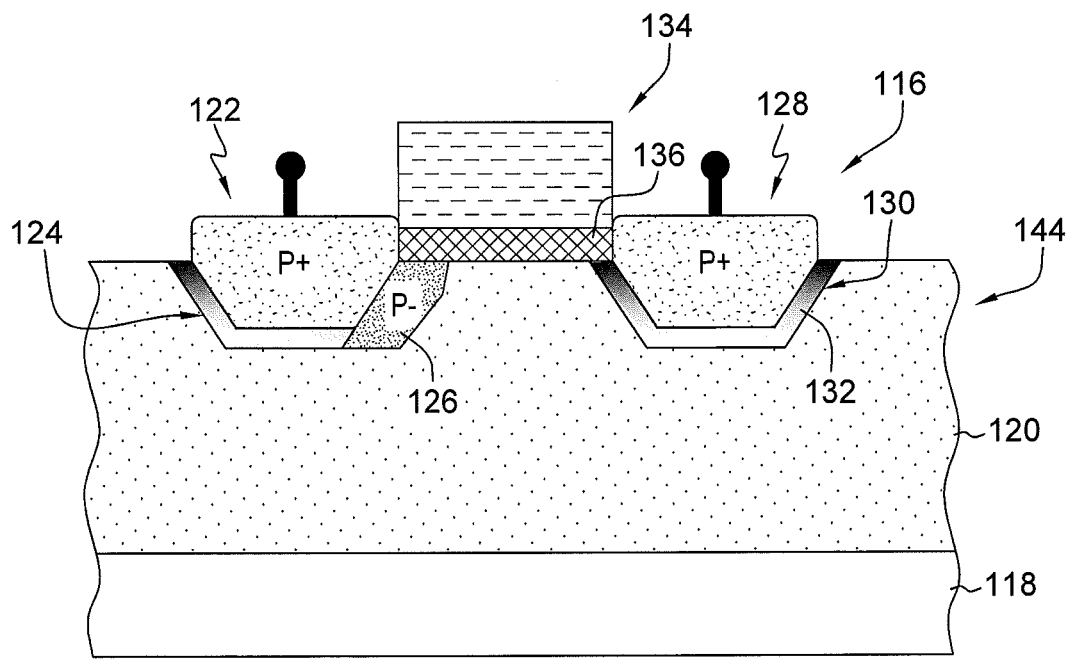
FIG. 2 is a cross-sectional view of another example of a parasitic lateral bipolar transistor having a basic structure similar to that of FIG. 1, the parasitic lateral bipolar transistor including a semiconductor substrate of n-type or p-type, a well of a type opposite that of the semiconductor substrate, a first region of an epitaxial material of a same type as the semiconductor substrate, the first region situated in a cavity of the well, the first region also including a halo implant of a same type as the first region, but with a lower dopant concentration, a second region of the epitaxial material in a cavity of the well, the second region including a graded border with the well of a same type as the first region, and a gate structure including a dielectric layer over the well, the gate structure situated between the first region and the second region, in accordance with one or more aspects of the present invention.

FIG. 2 is a cross-sectional view of another example of a parasitic lateral bipolar transistor 116 having a basic structure similar to that of FIG. 1, the parasitic lateral bipolar transistor including a semiconductor substrate 118 of n-type or p-type, a well 120 of a type opposite that of the semiconductor substrate, a first region 122 of an epitaxial material of a same type as the semiconductor substrate, the first region situated in a cavity 124 of the well, the first region also including a halo implant 126 of a same type as the first region, but with a lower dopant concentration, a second region 128 of the epitaxial material in a cavity 130 of the well, the second region including a graded border 132 with the well of a same type as the first region, and a gate structure 134 including a dielectric layer 136 over the well, the gate structure situated between the first region and the second region, in accordance with one or more aspects of the present invention.

Figure 3:
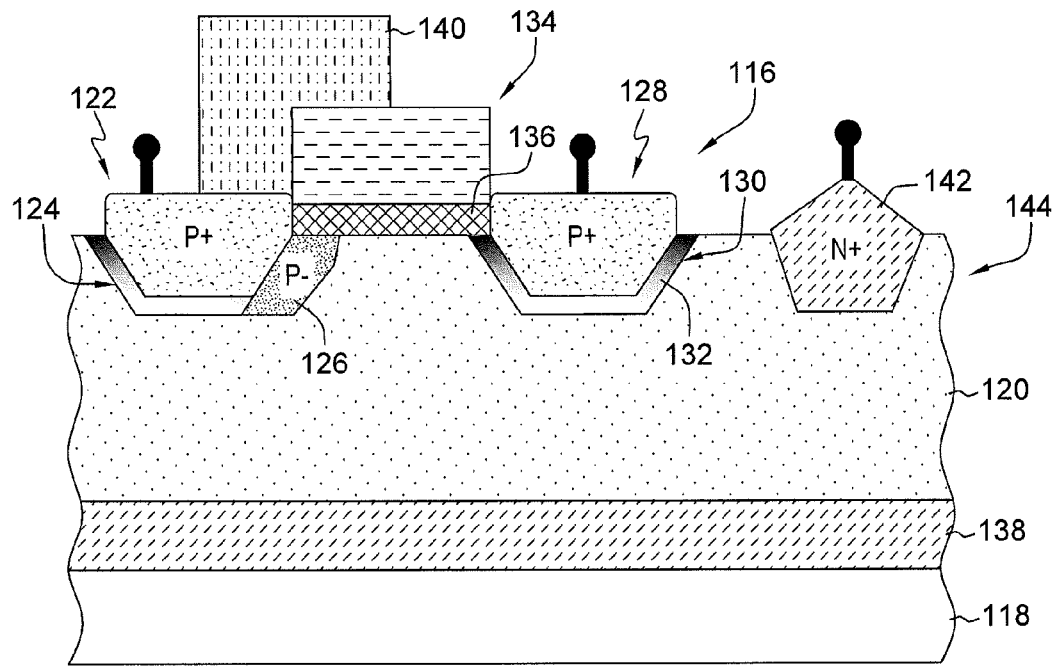
FIG. 3 depicts one example of the structure of FIG. 2 further including an optional layer of a same type as the well situated between the substrate and the well, an optional contact electrically connecting the first region with the well, and an optional well contact in a top portion of the well and separated from the first region, second region and gate structure, in accordance with one or more aspects of the present invention.

FIG. 3 depicts one example of the structure of FIG. 2 further including an optional layer 138 of a same type as the well 120 situated between the substrate 118 and the well, an optional contact 140 electrically connecting the first region 122 with the well, and an optional well contact 142 in a top portion 144 of the well and separated from the first region, second region 128 and gate structure 134, in accordance with one or more aspects of the present invention.

Figure 4:
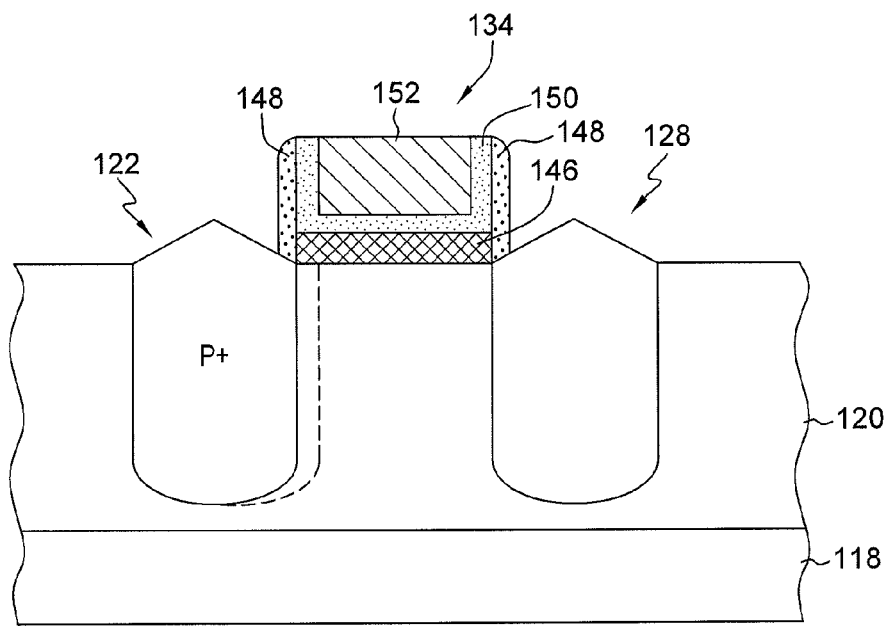
FIG. 4 depicts one example of the structure of FIG. 2, focusing on the gate structure, which, in this example, is a metal gate structure including a gate dielectric, a pair of spacers, a layer(s) of work function material and a metal fill layer, in accordance with one or more aspects of the present invention.

FIG. 4 depicts one example of the structure of FIG. 2, focusing on the gate structure 134, which, in this example, is a metal gate structure including gate dielectric 146, a pair of spacers 148, a layer(s) of work function material 150 and a metal fill layer 152, in accordance with one or more aspects of the present invention.

Figure 5:
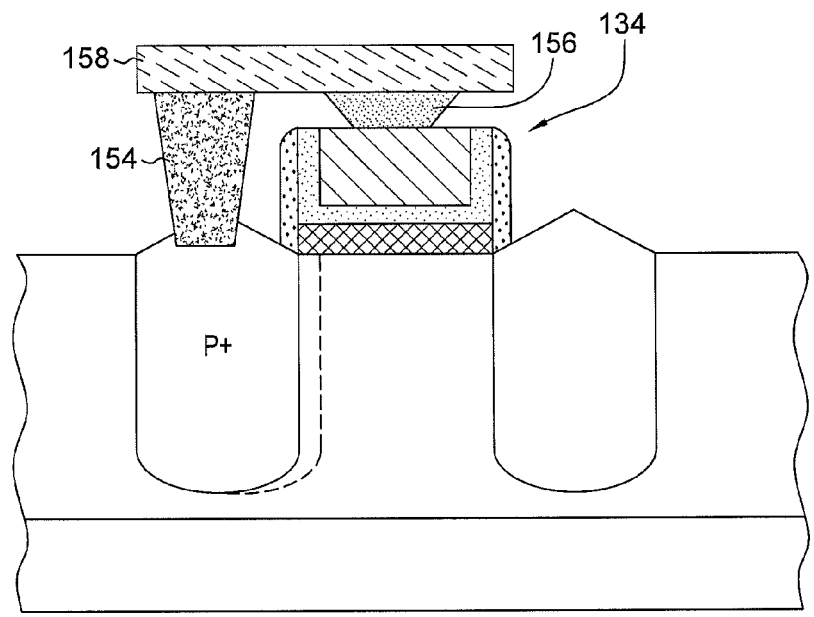
FIG. 5 depicts one example of the structure of FIG. 4 after forming a first region contact, a gate contact and a first metallization layer electrically connecting the first region contact and the gate contact, in accordance with one or more aspects of the present invention.

FIG. 5 depicts one example of the structure of FIG. 4 after forming a first region contact 154, in this case, the first region being a source, a gate contact 156 and a first metallization layer 158 electrically connecting the first region contact and the gate contact, in accordance with one or more aspects of the present invention.

Note that electrically coupling the source to the gate electrode allows for stable device performance in terms of, for example, $V_{be}$ (base-emitter voltage), Beta (Collector Current/Base Current), ideality and breakdown voltage. In addition, electrically connecting the source and gate electrode helps to minimize any impact of oxide change on PNP device performance and NPN bipolar device performance.

Figure 6:
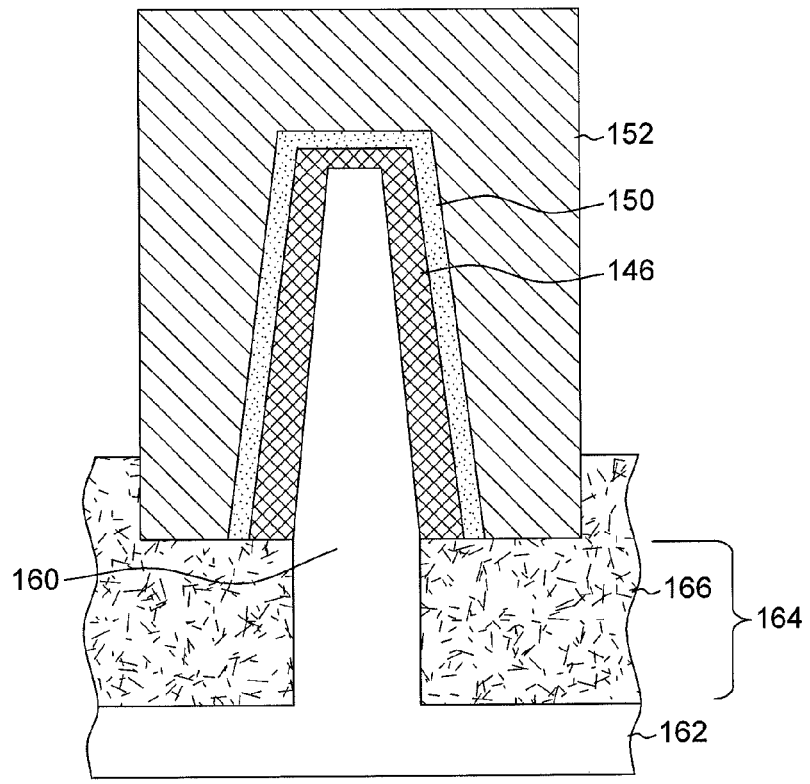
FIG. 6 depicts a cross-sectional view taken across a fin of one example of a FinFET version of the structure of FIG. 4, including a semiconductor substrate, a bottom portion of the fin being surrounded by an isolation layer, in accordance with one or more aspects of the present invention.

FIG. 6 depicts a cross-sectional view taken across a fin 160 of one example of a FinFET version of the structure of FIG. 4, including a semiconductor substrate 162, a bottom portion 164 of the fin being surrounded by an isolation layer 166, in accordance with one or more aspects of the present invention.

In a first aspect, disclosed above is a semiconductor structure. The semiconductor structure includes a semiconductor substrate of a first type, the first type includes one of p-type and n-type, and a well of a second type opposite the first type, the well acting as a base of a diode. The semiconductor structure includes a first region of the first type at a top of the well, a second region of the first type separate from the first region at the top of the well, the first region acting as an emitter of the diode and the second region acts as a collector of the diode, and a gate situated between the first region and second region over a top surface of the well.

In one example, the first region, the second region and the substrate are p-type, and the well is n-type.

In one example, the semiconductor structure of the first aspect may include, for example, a fin coupled to the semiconductor substrate, the well, the first region and the second region being situated in the fin, and the top surface of the well is a top surface of the fin.

In one example, the semiconductor structure of the first aspect may include, for example, a halo implant of the first type for the first region, a third region of the first type at a top of the well separated from the diode, and a dielectric layer under the gate, the dielectric layer and the gate being situated over the halo implant and the second region. In one example, the semiconductor structure may further include, for example, a contact electrically connecting the first region and the well.

In one example, the semiconductor structure may further include, for example, a layer of the second type situated between the well and the semiconductor substrate.

In one example, the first region and the second region may include, for example, epitaxial semiconductor material. In one example, the epitaxial semiconductor material may include, for example, epitaxial silicon germanium.

In one example, the third region may include, for example, epitaxial semiconductor material. In one example, the epitaxial semiconductor material may include, for example, epitaxial silicon phosphide.

In one example, the first region and the second region may each be separated from the well by a graded region of the first type.

In one example, the gate may include, for example, one or more work function materials and a gate electrode.

In one example, the semiconductor structure may further include, for example, a first contact for the first region, a second contact for the gate, and a metallization layer electrically connecting the first contact and the second contact.

In a second aspect, disclosed above is a method. The method includes providing a starting semiconductor structure, the starting semiconductor structure including a semiconductor substrate of a first type and a well of a second type opposite the first type above the semiconductor structure, each of the first type and second type include one of n-type and p-type. The method further includes forming a first region of the first type and a second region of the first type at a top portion of the well, and forming a gate situated between the first region and second region over a top surface of the well. When in use, the well acts as a base of a diode, the first region acting as an emitter of the diode and the second region acting as a collector for the diode.

In one example, the method may further include, for example, forming a fin coupled to the semiconductor structure, the well, first region and second region being situated at a top portion of the fin, and the top surface of the well being a top surface of the fin.

In one example, the method of the second aspect may further include, for example, forming a contact electrically connecting the first region and the well.

In one example, the method of the second aspect may further include, for example, forming a layer of the second type between the semiconductor substrate and the well.

In one example, the method of the second aspect may further include, for example, forming an electrical connection to the base, the forming includes one of forming a metal gate and forming a contact region of the second type at a top portion of the well separated from the first region and second region.

In one example, forming the first region and the second region in the method of the second aspect may include, for example, etching to form a cavity for each of the first region and the second region, forming epitaxial material of the first type in each cavity, and forming a halo implant for the first region.

In one example, the method of the second aspect may further include, for example, electrically connecting the first region and the well together.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
a semiconductor substrate of a first type, wherein the first type comprises one of p-type and n-type;
a well of a second type opposite the first type, wherein the well acts as a base of a diode;
a first region of the first type at a top of the well;
a second region of the first type separate from the first region at the top of the well, wherein the first region acts as an emitter of the diode and the second region acts as a collector of the diode; and
a gate situated between the first region and second region over a top surface of the well.

2. The semiconductor structure of claim 1, wherein the first region, the second region and the substrate are p-type, and wherein the well is n-type.

3. The semiconductor structure of claim 1, further comprising a fin coupled to the semiconductor substrate, wherein the well, the first region and the second region are situated in the fin, and wherein the top surface of the well is a top surface of the fin.

4. The semiconductor structure of claim 1, further comprising:
a halo implant of the first type for the first region;
a third region of the first type at a top of the well separated from the diode; and
a dielectric layer under the gate, wherein the dielectric layer and the gate are situated over the halo implant and the second region.

5. The semiconductor structure of claim 4, further comprising a contact electrically connecting the first region and the well.

6. The semiconductor structure of claim 4, further comprising a layer of the second type situated between the well and the semiconductor substrate.

7. The semiconductor structure of claim 4, wherein the first region and the second region comprise epitaxial semiconductor material.

8. The semiconductor structure of claim 7, wherein the epitaxial semiconductor material comprises epitaxial silicon germanium.

9. The semiconductor structure of claim 4, wherein the third region comprises epitaxial semiconductor material.

10. The semiconductor structure of claim 9, wherein the epitaxial semiconductor material comprises epitaxial silicon phosphide.

11. The semiconductor structure of claim 4, wherein the first region and the second region are each separated from the well by a graded region of the first type.

12. The semiconductor structure of claim 4, wherein the gate comprises one or more work function materials and a gate electrode.

13. The semiconductor structure of claim 4, further comprising:
 a first contact for the first region;
 a second contact for the gate; and
 a metallization layer electrically connecting the first contact and the second contact.

14. A method, comprising:
 providing a starting semiconductor structure, the starting semiconductor structure comprising a semiconductor substrate of a first type and a well of a second type opposite the first type above the semiconductor structure, wherein each of the first type and second type comprise one of n-type and p-type;
 forming a first region of the first type and a second region of the first type at a top portion of the well;
 forming a gate situated between the first region and second region over a top surface of the well; and
 wherein, when in use, the well acts as a base of a diode, the first region acts as an emitter of the diode and the second region acts as a collector for the diode.

15. The method of claim 14, further comprising forming a fin coupled to the semiconductor structure, wherein the well, first region and second region are situated at a top portion of the fin, and wherein the top surface of the well is a top surface of the fin.

16. The method of claim 14, further comprising forming a contact electrically connecting the first region and the well.

17. The method of claim 14, further comprising forming a layer of the second type between the semiconductor substrate and the well.

18. The method of claim 14, further comprising forming an electrical connection to the base, wherein forming the electrical connection comprises one of forming a metal gate and forming a contact region of the second type at a top portion of the well separated from the first region and second region.

19. The method of claim 14, wherein forming the first region and the second region comprises:
 etching to form a cavity for each of the first region and the second region;
 forming epitaxial material of the first type in each cavity; and
 forming a halo implant for the first region.

20. The method of claim 14, further comprising electrically connecting the first region and the well together.

* * * * *